United States Patent [19]

Poletto et al.

[11] Patent Number: 5,313,114
[45] Date of Patent: May 17, 1994

[54] COMPARATOR CIRCUIT WITH PRECISION HYSTERESIS AND HIGH INPUT IMPEDANCE

[75] Inventors: Vanni Poletto, Camino; Michelangelo Mazzucco, Santa Maria Del Tempio, both of Italy

[73] Assignees: Marelli Autronica S.P.A.; SGS-Thomson Microelectronics s.r.l., both of Milan, Italy

[21] Appl. No.: 815,158

[22] Filed: Dec. 31, 1991

[30] Foreign Application Priority Data

Dec. 31, 1991 [IT] Italy ............................... 68085 A/90

[51] Int. Cl.⁵ ............... H03K 5/22; H03K 17/56; H03K 17/60; H03K 3/01
[52] U.S. Cl. ..................... 307/355; 307/241; 307/255; 307/270; 307/494
[58] Field of Search ............ 307/355, 494, 496, 241, 307/254, 255, 270

[56] References Cited

U.S. PATENT DOCUMENTS

| | | | |
|---|---|---|---|
| 4,056,740 | 11/1977 | Schoeff | 307/496 |
| 4,536,663 | 8/1985 | Miller et al. | 307/496 |
| 4,554,468 | 11/1985 | Rumbaugh et al. | 307/355 |
| 4,634,897 | 1/1987 | Yoshioka | 307/355 |
| 4,988,895 | 1/1991 | Kihara et al. | 307/494 |
| 5,075,567 | 12/1991 | Kubota | 307/494 |
| 5,182,471 | 1/1993 | Yoshida | 307/355 |

OTHER PUBLICATIONS

Schroeder, "Voltage Level Detector," *IBM Technical Disclosure Bulletin*, (9):11 1643-1644, Apr., 1967.
Marchas, "Un Generateur de Fonction de Laboratoire 2e partie: Réalisation", Electronique Applications (20): 103-105, Nov. 1981.

*Primary Examiner*—William L. Sikes
*Assistant Examiner*—Trong Phan
*Attorney, Agent, or Firm*—Seed and Berry

[57] ABSTRACT

The amplitude of the hysteresis of the circuit is determined principally by the intensity of the current produced by a generator by means of a "band gap" reference voltage, an internal resistance of the circuit, and the resistances connected to the emitters of the input-stage transistors, enabling a high degree of precision to be achieved. The inputs of the circuit are defined by the bases of the input-stage transistors and therefore have high impedance. The preferred application is for forming interface circuits for sensors to be fitted in motor vehicles.

20 Claims, 3 Drawing Sheets

COMPARATOR CIRCUIT WITH PRECISION HYSTERESIS AND HIGH INPUT IMPEDANCE

BACKGROUND OF THE INVENTION

The present invention relates in general to electronic circuits and particularly concerns the comparator circuits commonly used in electronic circuits. It has been developed with particular attention to its possible use for producing monolithic comparator circuits with precision hysteresis and high input impedance.

There is a particular need for comparators with these characteristics in order to produce interfaces between sensors with variable reluctance (for example, sensors used to detect the speed and position of the shaft of an internal combustion engine in a motor vehicle) and the corresponding processing circuits (for example, in the case of the sensors mentioned above, the electronic control unit of the engine).

For use in such a situation, the comparator must detect a signal the level of which (for example 100 mV), in some situations, is little greater than a lower limit level (for example, 50 mV) below which no detection should take place. There is therefore a need for a comparator which has the broadest possible hysteresis so that it is substantially insensitive to noise (which is present to a considerable extent in an automotive environment) but which, at the same, can ensure operation in the limit condition indicated above, taking account of the spread of the hysteresis value, both as regards its absolute value and in relation to temperature. Moreover, a further input impedance is also required to prevent errors due to the high resistances of the sources which drive the comparator.

DESCRIPTION OF THE PRIOR ART

FIG. 1 shows a typical layout of a comparator circuit 1 with hysteresis which is formed by an operational amplifier 2 with respective non-inverting and inverting inputs 3, 4 and two resistors RO1 and RO2 connected respectively between a first source V1 and the non-inverting input 3 and between the non-inverting input 3 and the output 5 of the operational amplifier 2. Another source V2 is connected to the inverting input 4.

According to widely known principles, such a circuit has a high-level output equal to the voltage supply Vcc, which is less than the saturation voltage $V_{CE}$ of the output transistor, and a low-level output equal to the earth voltage or to $-Vcc$, plus a saturation voltage $V_{CE}$ of the same transistor.

This structure has the advantage of considerable simplicity. It has the disadvantage, however, that its hysteresis is imprecise (in relation to temperature and as regards its absolute value) because of the error introduced by the saturation voltage $V_{CE}$ and also because of the error introduced by the imprecision of the supply voltage.

Structures such as that shown in FIG. 2 have been used to overcome this limitation and, in these, the hysteresis is determined by a resistance, which is in series with one of the inputs, and through which a current, generally produced by a "band gap" reference voltage and another high resistance within the circuit, is forced. This is done with the use, for example, of two transistors T1 and T2 as well as a reference diode D, shown schematically in FIG. 2, in which the generator which produces the current is indicated $I_0$.

This solution has a very precise hysteresis value which depends on the precision of the reference voltage and the ratio between two internal resistances. Unfortunately, the current sent to the resistance in series with the input (the resistance $R_{00}$ in FIG. 2) has to be supplied by its own source which must have a low output resistance in order not to introduce further errors.

OBJECT AND SUMMARY OF THE INVENTION

The object of the present invention is therefore to provide a comparator circuit with hysteresis which, whilst still having characteristics such that it can be produced in the form of a monolithic integrated circuit, achieves wholly satisfactory operating conditions, particularly as regards the precision of the hysteresis and the high input impedance.

According to the present invention, this object is achieved by a circuit having the specific characteristics claimed in the following claims.

DETAILED DESCRIPTION OF THE INVENTION

Figure 1:
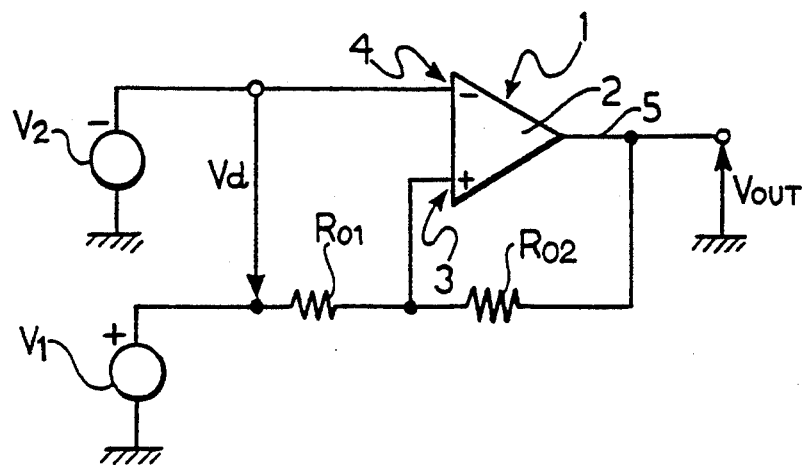
Figure 2:
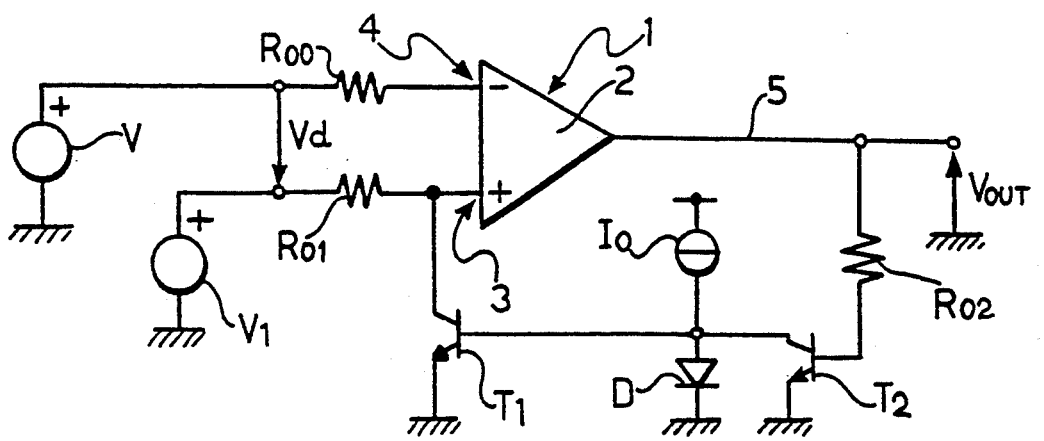
Figure 3:
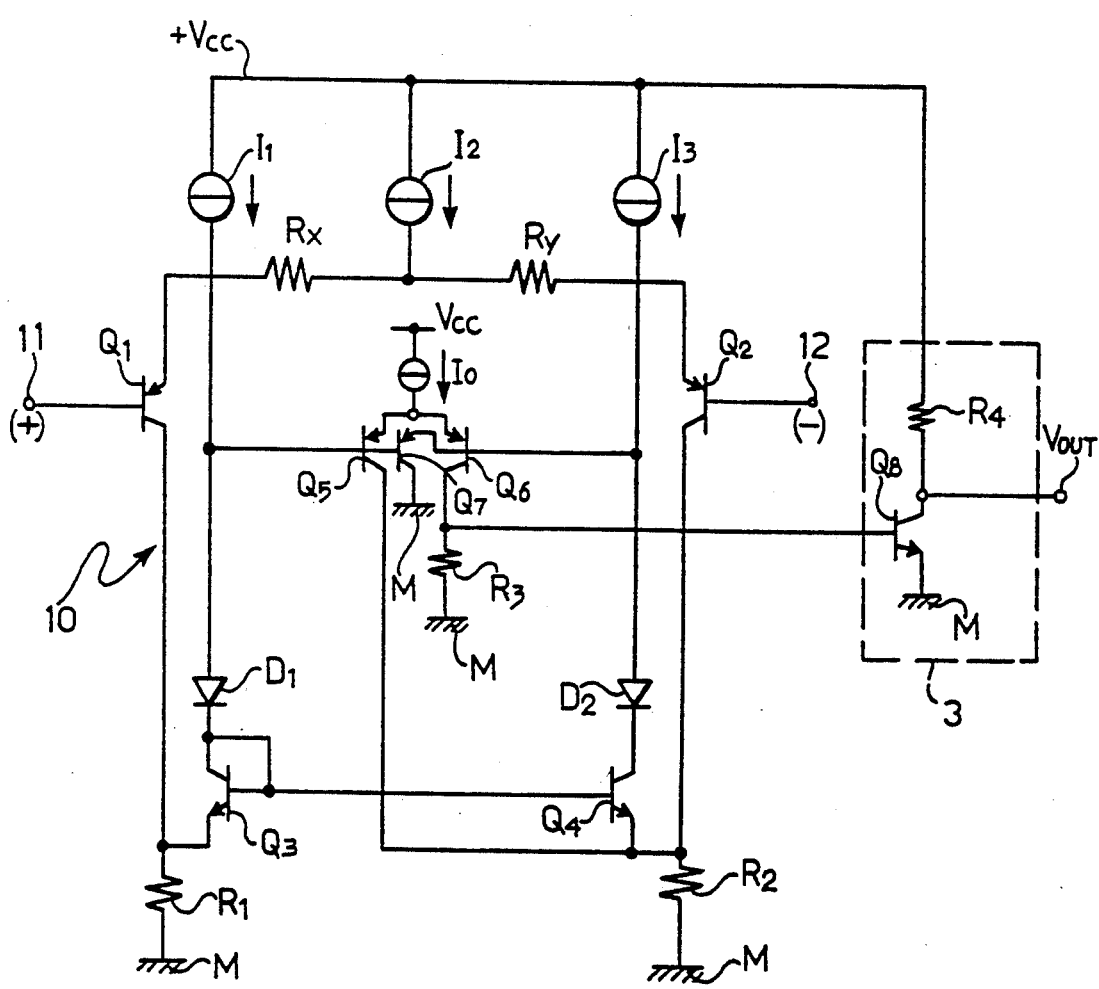
Figure 4:
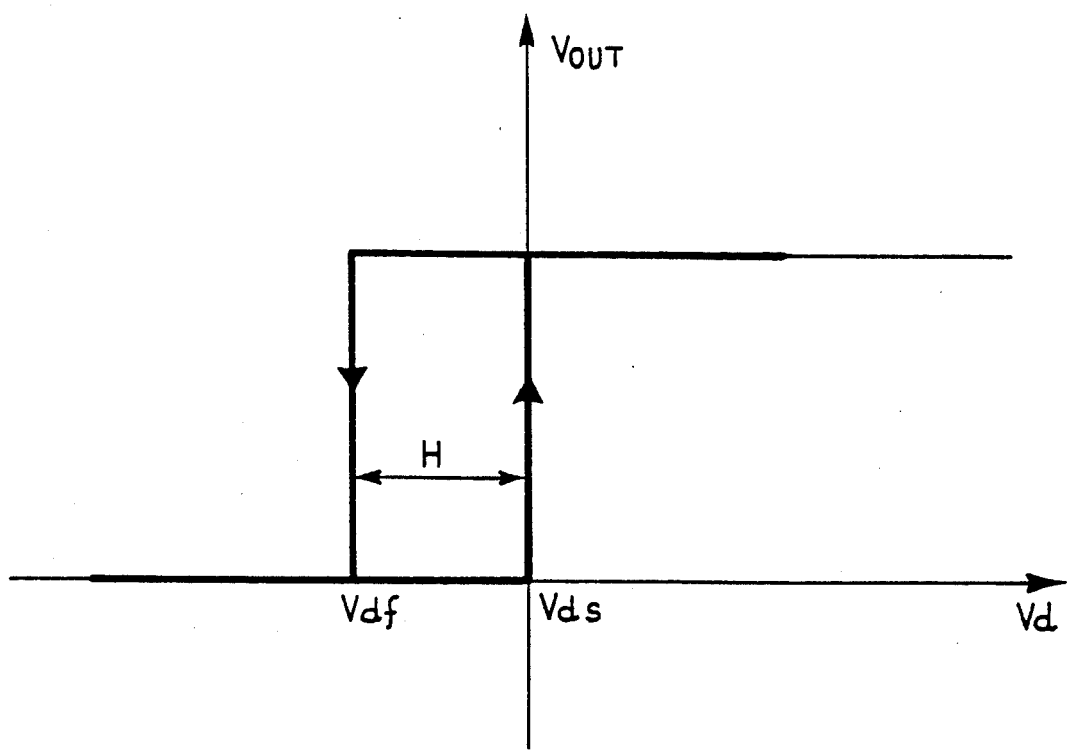

The invention will now be described, purely by way of non-limiting example, with reference to the appended drawings, in which:

FIGS. 1 and 2 which relate to the prior art, have already been described above,

FIG. 3 shows concisely the structure of the circuit of the comparator with hysteresis according to the invention, and FIG. 4 shows in the form of a graph, the hysteresis characteristics exhibited by the circuit of FIG. 3.

As a general premise, it should be stated that the description of a preferred embodiment of the invention, is given with specific reference to the generalised use of bipolar transistors. This example is not intended, however, to be limiting as regards the possibility of replacing at least some of the transistors by transistors of a different type (typically FETs) or even by components of different types but with substantially equivalent functional behaviour.

The comparator circuit of FIG. 3 which is generally indicated 10, has two inputs 11, 12 which have non-inverting and inverting input characteristics respectively and are connected, respectively, to the bases of two transistors Q1 and Q2 which are shown in the form of p-n-p transistors. The collectors of the transistors Q1 and Q2 are connected to the earth of the circuit by means of respective resistors R1 and R2 and their emitters are connected—by means of respective resistors Rx and Ry (which for the moment will be considered to be of identical value R=Rx=Ry)—to a constant-current generator I2 (of known type which does not need to be described in detail herein) which is connected to the supply voltage Vcc.

The emitters of two further transistors Q3 and Q4 (which are of the n-p-n type and hence are complementary to the transistors Q1 and Q2 in the embodiment illustrated) are connected respectively to the collector of the transistor Q1 and to the collector of the transistor Q2.

The bases of the transistors Q3 and Q4 are connected to each other and the base of the transistor Q3 is short-circuited to its collector which is connected by means of a diode D1, the cathode of which faces the transistor Q3, to a constant-current generator I1 (also of known type and connected to the supply voltage Vcc). In a generally complementary arrangement, the collector of the transistor Q4 is connected to a respective constant-current generator I3 by means of a respective diode D2, the cathode of which faces the transistor Q4. The anodes of the diodes D1 and D2 (and hence, indirectly, the collectors of the transistors Q3 and Q4) are connected to the bases of two further transistors Q5 and Q6 (which are of the p-n-p type and hence are homologous to the transistors Q1 and Q2), the emitters of which are connected to each other and to a constant-current generator I₀.

Like the generators I1, I2 and I3 mentioned above, this generator is of known type and is connected to the supply voltage Vcc.

The collector of the transistor Q5 is connected to the emitter of the transistor Q4 and hence to the collector of the transistor Q2. The collector of the transistor Q6, however, is connected by means of a transistor R3 to the earth M of the circuit and supplies the base of a further transistor Q8 (of the n-p-n type) which constitutes the output stage of the comparator circuit and, for this purpose, has its emitter connected to the earth M and its collector, from which the output voltage Vout of the circuit is taken, to the supply voltage Vcc, by means of a resistor R4.

Finally, for reasons which will become clearer from the following, a further p-n-p transistor Q7 is interposed between the transistors Q5 and Q6 with its base connected to the transistor Q5, its emitter connected to the base of the transistor Q6, and its collector connected to the earth M.

The input stage of the circuit 10 which is constituted by the transistors Q1 and Q2 is formed by, so to speak, "degenerating" the emitters of the two transistors which form the differential input pair with the two resistors Rx and Ry. A signal Vd which is the difference between the non-inverting input 11 and the inverting input 12 thus causes (according to widely known mechanisms) a negative change in the collector current of Q1 and a positive change in the collector current of Q2. The absolute values Δ $I_c$ of these changes, however, are equal and are given by:

$$\Delta I_c = Vd/2R \tag{I}$$

in which, as already stated, it is assumed that Rx=Ry=R.

By means of the resistors R1 and R2 (the absolute values of which are generally equal but which are identified by different reference numerals for the purposes of the explanation), the output currents of Q1 and Q2 drive the second differential stage defined by the transistors Q5 and Q6, by means of the intermediate stage formed by the transistors Q3 and Q4 and the diodes D1 and D2.

As already stated with reference to FIG. 2, the polarisation current Io is supplied by a "band gap" reference voltage and by an internal resistance of the integrated circuit; this is all according to widely known criteria which do not need to be recited herein. In general, the intensity of the current Io can be expressed approximately as:

$$I_o = V_{BG}/Rf \tag{II}$$

in which $V_{BG}$ is the "band gap" voltage and Rf is the aforesaid internal resistance of the integrated circuit.

If the differential input voltage is negative (if the voltage at the input 12 is higher than the voltage at the input 11), the voltage at the base of Q5 will generally be:

$$V_{BE}(Q3) + V_{D1} + R1(I1+I2) \tag{III}$$

in which $V_{BE}(Q3)$ is the base-emitter voltage of the transistor Q3 and $V_{D1}$ is the voltage across the diode D1.

This voltage will be higher than the voltage at the base of Q6, which is:

$$V_{CEsat}(Q4) + V_{D2} + R2 \cdot I3 \tag{IV}$$

in which $V_{CEsat}(Q4)$ is the saturation collector-emitter voltage of the transistor Q4 and $V_{D2}$ is the voltage across the diode D2.

Naturally, in the equations (III) and (IV), I1, I2 and I3 indicate the intensities of the currents generated by the corresponding generators or sources.

Under the conditions indicated above, the current Io will pass through R3 and the base of Q8, thus forcing the output of the circuit 10 to a low level.

The switching point, which occurs when the voltages in R1 and R2 are equal, thus takes place with a differential input voltage Vd=0, at which the currents in Q1 and Q2, and in R1 and R2, are equal. In this connection, it may be noted that, in general, the intensities of the currents of the generators I1, I2 and I3 are identical but are indicated by different reference numerals for clarity of explanation. Under the conditions indicated above, in particular, $$R1\left(I1 + \frac{I2}{2}\right) = R2\left(I3 + \frac{I2}{2}\right) \tag{V}$$

Starting from this condition, if the differential input voltage is gradually increased so that it becomes positive (if the voltage at the input 11 becomes higher than the voltage at the input 12), the input stage defined by the transistors Q1 and Q2 will switch, consequently changing the inputs of the differential stage defined by the transistors Q5 and Q6. Under these conditions, the voltage at the base of Q6 will be:

$$R1 \cdot I1 + V_{BE}(Q3) + V_{D1} + V_{BE}(Q7) \tag{VI}$$

in which $V_{BE}(Q3)$ and $V_{BE}(Q7)$ indicate the base-emitter voltages of the transistors Q3 and Q7. At the same time, the voltage at the base of Q5 changes to the value:

$$R1 \cdot I1 + V_{BE}(Q3) + V_{D1} \tag{VII}$$

These voltages at the bases of Q5 and Q6 now change the current Io through R2 and there is no longer a current through R3 or at the base of Q8. The transistor Q8 becomes non-conductive and the output voltage Vout rises to the value Vcc.

Meanwhile, the transistor Q7 between the transistors Q5 and Q6 prevents the voltage at the base of Q6 from rising to the value Vcc, thus preventing the current generator I3 from reaching saturation. This measure prevents delays in the return of the current-generator in question to the active zone as well as preventing interference on the polarisation lines of the current generators.

Whilst the output voltage Vout rises to the value Vcc, the current in R1 is equal to I1 and the current in R2 is equal to the sum of Io+I2+I3.

Starting from this condition, the new switching point will occur with an input differential Vdf such that:

$$\frac{Vdf}{2R} = -\frac{Io}{2} = \frac{Ic1 - Ic2}{2} \qquad \text{(VIII)}$$

For this value of Vd, the collector currents of Q1 and Q2, which are indicated Ic1 and Ic2 respectively will be:

$$Ic1 = \frac{I2}{2} + \frac{Io}{2}; Ic2 = \frac{I2}{2} - \frac{Io}{2} \qquad \text{(IX)}$$

For these values of Ic1 and Ic2, the voltages in R1 and R2 are again equal since in fact:

$$R1\left(I1 + \frac{I2}{2} + \frac{Io}{2}\right) = R3\left(I3 + \frac{I2}{2} - \frac{Io}{2} + Io\right) \qquad \text{(X)}$$

From this equilibrium condition, a minimal decrease in the differential input voltage suffices to return the circuit to the starting conditions, that is, with the differential stage defined by the transistors Q5 and Q6 unbalanced so that the current of $I_0$ is sent to R3 and to the base of Q8, saturating this transistor and returning the output voltage to a voltage value $V_{CEsat}$ (the collector-emitter saturation voltage) relative to the earth.

The graph of FIG. 4 shows schematically the behaviour of the output voltage Vout as a function of the differential input voltage Vd, showing the amplitude of the hysteresis H which is defined as the difference between the voltages Vds and Vdf at which the circuit switches up and down respectively.

The main advantages of the invention can be expressed in the following terms.

The circuit 10 according to the invention shows precise hysteresis determined by the current produced by the generator Io (in known manner, by a "band gap" reference voltage and an internal resistance) and by the resistance values Rx=Ry=R at the emitters of Q1 and Q2. In fact, the hysteresis value H is:

$$H = R.Io, \text{ where } Io = V_{BG}/R_{int} \qquad \text{(XI)}$$

In practice, the hysteresis H is determined by the precision of the reference voltage and the precision of a ratio between two internal resistances of the integrated circuit; the precision of this resistive ratio can be kept within 1% by current layout techniques At the same time, the input stage is a high-impedance stage, since the inputs are constituted by the bases of the two transistors Q1 and Q2, and these inputs are also compatible with the earth.

As well as supplying the hysteresis, the second differential stage (that constituted by the transistors Q5 and Q6) also drives the output stage (the transistor Q8) since it can ensure the dynamics of a $V_{BE}$ relative to the earth by means of the diodes D1 and D2. The presence of the transistor Q7 also ensures that the current generator I3 never reaches saturation.

It has been implicitly assumed above that the resistors Rx and Ry connected to the emitters of Q1 and Q2 have the same value. It is possible, however, to consider selecting different values such that their sum is still equal to 2R. In this case the hysteresis value H would in any case be identical to that calculated above in terms of its precision and its absolute value.

The upward switching point (Vds) however will now be changed to the value:

$$Vd = Vds = I2\left(\frac{R_y}{2} - \frac{R_x}{2}\right) \qquad \text{(XII)}$$

in which Vds can have the same precision as H if the generator I2 is formed, according to known principles and on the basis of criteria which do not give rise to particular difficulties, in the same manner as Io.

Naturally, the principle of the invention remaining the same, the details of construction and forms of embodiment may be varied widely with respect to those described and illustrated, without thereby departing from the scope of the present invention. This applies in particular as regards the possible replacement of at least some of the bipolar transistors described above by components of different kinds, for example, by field-effect transistors. In this case, the terms "base", "emitter", and "collector" used in the present description and in the following claims should be understood as also covering the "gate", "source" and "drain" terminals of field-effect transistors.

What is claimed is:

1. A comparator circuit with hysteresis including:
   an input stage with first and second transistors, the bases of which receive respective input signals which together define an input difference signal, respective resistors being connected to the emitters of the first and second so that the respective emitter resistors determine the intensities of the variations in the collector currents induced in the first and second transistors by variations in the input difference signal,
   and a differential signal with first and second differential stage transistors, the bases of which are sensitive to the collector currents of the first and second transistors, respectively, the emitters of the first and second differential stage transistors being connected to a constant-current source and at least one of the first and second differential stage transistors driving the output of the circuit, the arrangement being such that the differential stage permits first and second operating conditions, in which the constant current passing respectively through the first and second differential stage transistors and the output of the circuit assumes two different respective levels, the switching between the first and second operating conditions and between the second and first operating conditions taking place respectively at a first level and at a second level of the input signal difference the difference between the first and second difference signal levels defining the hysteresis and being univocally determined by the resistances of the emitter resistors and by the value of the constant current.

2. A circuit according to claim 1 wherein respective collector resistors are connected to the collectors of the first and second transistors in order to generate respective amperometric signals indicative of the intensities of the collector currents of the respective transistors at the bases of the first and second differential stage transistors.

3. A circuit according to claim 2, wherein said respective collector resistors have identical resistance values.

4. A circuit according to claim 1, wherein said respective emitter resistors have equal resistance values, so that the first input signal difference value is substantially equal to zero.

5. A circuit according to claim 1, wherein said respective emitter resistors have different resistance values so that the first input signal difference level depends on the difference between the resistances of the respective resistors.

6. A comparator circuit will hysteresis including:
an input stage with first and second transistors, the bases of which receive respective input signals which together define an input difference signal, respective resistors being connected to the emitters of the first and second so that the respective emitter resistors determine the intensities of the variations in the collector currents induced in the first and second transistors by variations in the input difference signal;
a differential stage with a first differential stage transistor and a second differential stage transistor, the bases of which are sensitive to the collector currents of the first and second transistors, respectively, the emitters of the first and second differential stage transistors being connected to a constant-current source and at least one of the first and second differential stage transistors driving the output of the circuit; and
first and second further transistors interposed between the first transistor and the first differential stage transistor and between the second transistor and the second differential stage transistor, respectively, for transferring the collector currents of the first transistor and of the second transistor to the bases of the first and second differential stage transistors, respectively, the arrangement being such that the differential stage permits first and second operating conditions, in which the constant current passing respectively through the first and second differential stage transistors and the output of the circuit assumes two different respective levels, the switching between the first and second operating condition and between the second and first operating condition taking place respectively at a first level and at a second level of the input signal difference the difference between the first and second difference signal levels defining the hysteresis and being univocally determined by the resistances of the emitter resistors and by the value of the constant current.

7. A circuit according to claim 6 wherein the first and second transistors and the first and second differential stage transistors have homologous polarity while the polarity of the first and second further transistors is the opposite of that of the first and second transistors to which they are connected.

8. A circuit according to claim 6 wherein the first and second further transistors drive the bases of the first and second differential stage transistors, respectively, by means of their collectors.

9. A circuit according to claim 8 wherein a diode, through which the collector current of each of the first and second further transistors can pass, is connected to the collector of each respective further transistor.

10. A circuit according to claim 6 wherein the collector of each of the first and second further transistors is supplied by a constant-current source.

11. A comparator circuit with hysteresis including:
an input stage with first and second transistors, the bases of which receive respective input signals which together define an input difference signal, respective resistors being connected to the emitters of the first and second so that the respective emitter resistors determine the intensities of the variations in the collector currents induced in the first and second transistors by variations in the input difference signal;
a differential stage with first and second differential stage transistors, the bases of which are sensitive to the collector currents of the first and second transistors, respectively, the emitters of the first and second differential stage transistors being connected to a constant-current source and at least one of the first and second differential stage transistors driving the output of the circuit; and
protective transistor interposed between the bases of the first and second differential stage transistors for preventing the base of the transistor, of the first and second differential stage transistors, which drives the output of the circuit, from reaching the level of the supply voltage, the arrangement being such that the differential stage permits first and second operating conditions, in which the constant current passing respectively through the first and second differential stage transistors and the output of the circuit assumes two different respective levels, the switching between the first and second operating conditions and between the second and first operating conditions taking placing respectively at a first level and at a second level of the input signal difference the difference between the first and second difference signal level defining the hysteresis and being univocally determined by the resistances of the emitter resistors and by the value of the constant current.

12. A circuit according to claim 11 wherein the emitter of the protective transistor is connected to the base of the transistor, of the first and second differential stage transistors, which drives the output of the circuit and its base is connected to the other of the first and second differential stage transistors.

13. A circuit according to claim 1, having an output stage including an output transistor which is driven by the differential stage.

14. A comparator circuit with hysteresis, comprising:
an input stage having first and second branches, each with an input terminal, and receiving first and second input signals, respectively, to define an input difference signal, said first and second branches having an electrical current flowing therein, a value of said first and second currents being determined by first and second resistors in said first and second branches, respectively;
a differential stage having first and second differential branches electrically coupled to said input stage and responsive to said first and second currents, said differential stage being biased by a constant current source, said first differential branch providing a feedback connection to said input stage to provide a hysteresis for the circuit; and
an output stage electrically coupled to said differential stage and receiving a differential stage output signal from said differential stage, said output stage switching between first and second output voltage levels, said switching from said first output voltage level to said second output voltage level and from said second output voltage level to said first output voltage level taking place at a first level and a second level of said input difference signal, respectively, the difference between first and second levels defining said hysteresis and being determined by resistance values of said first and second resistors and the value of said constant current source.

15. The circuit of claim 14, further including an intermediate stage interposed between said input stage and said differential stage for transferring said first and second currents from said input stage to said differential stage.

16. The circuit of claim 15 wherein the circuit is supplied with power by a supply voltage, the circuit further including a protective stage electrically coupled to said differential stage to prevent said intermediate stage from reaching the level of the supply voltage.

17. The circuit according to claim 14 wherein said first and second resistances have identical resistance values, said first level of said input difference signal being substantially equal to zero volts.

18. The circuit of claim 14 wherein said first and second resistances have different resistance values, said first level of said input difference signal being dependent on the difference between said resistance values.

19. The circuit of claim 14 wherein said second differential branch provides said differential stage output signal, said second differential branch not being electrically coupled to said feedback connection, said first differential branch being electrically coupled to said input stage to provide said feedback connection.

20. The circuit of claim 19 wherein said first differential branch includes a first differential transistor whose collector is electrically coupled to a collector of an input transistor in said input stage to provide said feedback connection, said second differential branch comprising a second differential transistor whose collector is electrically coupled to said output stage.

* * * * *

UNITED STATES PATENT AND TRADEMARK OFFICE
CERTIFICATE OF CORRECTION

PATENT NO. : 5,313,114
DATED : May 17, 1994
INVENTOR(S) : Vanni Poletto and Michelangelo Mazzucco It is certified that error appears in the above-identified patent and that said Letters Patent is hereby corrected as shown below:

In column 6, claim 1, line 39, please delete "signal" and substitute --stage--.

In column 7, claim 6, line 46, please delete "condition" and substitute therefor --conditions--.

In column 7, claim 6, line 47, please delete "condition" and substitute therefor --conditions--.

In column 8, claim 11, line 38, please delete "level" and substitute therefor --levels--.

In column 9, claim 14, line 8, after "between" and before "first" please insert --said--.

Signed and Sealed this

First Day of November, 1994

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO.    :   5,313,114
DATED         :   May 17, 1994
INVENTOR(S)   :   Vanni Poletto and Michelangelo Mazzucco It is certified that error appears in the above identified patent and that said Letters Patent is hereby corrected as shown below:

On the cover page under item [30], after "31," please delete "1991" and substitute therefor --1990--.

Signed and Sealed this

Fourteenth Day of November, 1995

*Attest:*

BRUCE LEHMAN

*Attesting Officer*   *Commissioner of Patents and Trademarks*